United States Patent
Pophristic et al.

(10) Patent No.: US 7,253,015 B2
(45) Date of Patent: Aug. 7, 2007

(54) LOW DOPED LAYER FOR NITRIDE-BASED SEMICONDUCTOR DEVICE

(75) Inventors: Milan Pophristic, North Brunswick, NJ (US); Michael Murphy, Somerset, NJ (US); Richard A. Stall, Belle Mead, NJ (US); Bryan S. Shelton, Bound Brook, NJ (US); Linlin Liu, Hillsborough, NJ (US); Alex D. Ceruzzi, Princeton Junction, NJ (US)

(73) Assignee: Velox Semiconductor Corporation, Somerset, NJ (US)

( * ) Notice: Subject to any disclaimer, the term of this patent is extended or adjusted under 35 U.S.C. 154(b) by 66 days.

(21) Appl. No.: 10/780,526

(22) Filed: Feb. 17, 2004

(65) Prior Publication Data

US 2005/0179107 A1 Aug. 18, 2005

(51) Int. Cl.
- H01L 21/00 (2006.01)
- H01L 33/00 (2006.01)
- H01L 23/48 (2006.01)
- H01L 23/52 (2006.01)
- H01L 29/40 (2006.01)

(52) U.S. Cl. .............. 438/46; 438/47; 257/94; 257/96; 257/745

(58) Field of Classification Search .......... 438/46, 438/47; 257/94–96, 745, 103
See application file for complete search history.

(56) References Cited

U.S. PATENT DOCUMENTS

| 5,158,909 A | 10/1992 | Ohtsuka et al. |
| 5,296,395 A | 3/1994 | Khan et al. |
| 5,399,887 A | 3/1995 | Weitzel et al. |
| 5,602,418 A | 2/1997 | Imai et al. |
| 5,625,202 A | 4/1997 | Chai |
| 5,789,760 A | 8/1998 | Irikawa et al. |
| 5,877,558 A | 3/1999 | Nakamura et al. |
| 6,437,374 B1 | 8/2002 | Northrup et al. |
| 6,455,877 B1 | 9/2002 | Ogawa et al. |
| 6,479,844 B2 | 11/2002 | Taylor |

(Continued)

FOREIGN PATENT DOCUMENTS

EP 1 189 287 A 3/2002

(Continued)

OTHER PUBLICATIONS

"High barrier height GaN Schottky diodes: Pt/GaN and Pd/GaN" Applied Physics Letters, American Institute of Physics, New York, US, vol. 68 No. 9, Feb. 26, 1996; pp. 1267-1269.

(Continued)

*Primary Examiner*—Sara Crane
*Assistant Examiner*—Samuel A. Gebremariam
(74) *Attorney, Agent, or Firm*—Lerner, David, Littenberg, Krumholz & Mentlik, LLP

(57) ABSTRACT

A repeatable and uniform low doped layer is formed using modulation doping by forming alternating sub-layers of doped and undoped nitride semiconductor material atop another layer. A Schottky diode is formed of such a low doped nitride semiconductor layer disposed atop a much more highly doped nitride semiconductor layer. The resulting device has both a low on-resistance when the device is forward biased and a high breakdown voltage when the device is reverse biased.

36 Claims, 1 Drawing Sheet

U.S. PATENT DOCUMENTS

| | | |
|---|---|---|
| 6,507,041 B2 | 1/2003 | Nakamura et al. |
| 6,555,451 B1 | 4/2003 | Kub et al. |
| 6,555,452 B2 | 4/2003 | Nikolaev et al. |
| 6,586,777 B1 | 7/2003 | Yuasa et al. |
| 6,586,781 B2 | 7/2003 | Wu et al. |
| 6,610,995 B2 | 8/2003 | Nakamura et al. |
| 6,653,215 B1 | 11/2003 | Brown et al. |
| 6,712,478 B2 * | 3/2004 | Sheu et al. ............ 257/79 |
| 2001/0034116 A1 | 10/2001 | Lee et al. |
| 2002/0127787 A1 | 9/2002 | Huang et al. |
| 2002/0155634 A1 * | 10/2002 | D'Evelyn et al. .......... 438/48 |
| 2002/0190263 A1 | 12/2002 | Hata et al. |
| 2003/0006415 A1 | 1/2003 | Yokogawa et al. |
| 2003/0010993 A1 * | 1/2003 | Nakamura et al. .......... 257/99 |
| 2003/0015708 A1 | 1/2003 | Parikh et al. |
| 2003/0062525 A1 | 4/2003 | Parikh et al. |
| 2003/0075728 A1 | 4/2003 | Tooi et al. |
| 2003/0141518 A1 | 7/2003 | Yokogawa et al. |

FOREIGN PATENT DOCUMENTS

| | | |
|---|---|---|
| WO | WO-03/026021 A | 3/2003 |

OTHER PUBLICATIONS

Lin Yow-Jon et al: "Nitrogen-vacancy-related defects and Fermi level pinning in n-GaN Schottky diodes" Aug. 1, 2003, Journal of Applied Physics, American Institute of Physics, New York, US, pp. 1819-1822.

Yanagihara, et al., "Development of GaN-Based Electronic Device on Si", Sanken Technical Report, vol. 35, No. 1 (2003), pp. 11-14, Japan (English—language translation of Japanese—language publication).

* cited by examiner

LOW DOPED LAYER FOR NITRIDE-BASED SEMICONDUCTOR DEVICE

BACKGROUND OF THE INVENTION

The present invention is directed to semiconductor devices and, more particularly, to nitride-based semiconductor devices, such as Schottky diodes, and to processes for making the same.

Nitride-based semiconductors, such as gallium nitride and gallium nitride-based semiconductors, are widely regarded as desirable wide bandgap compound semiconductors. These materials have been adopted in optoelectronic devices, such as light-emitting diodes (LEDs), laser diodes and photodiodes, and have also been employed in non-optical electronic devices, such as field effect transistors (FETs) and field emitters. In optoelectronic devices, the wide bandgap of the material allows for emission or absorption of light in the visible-to-ultraviolet range. In electronic devices, gallium nitride and its related materials provide high electron mobility and allow for operation at very high signal frequencies.

The properties of nitride-based semiconductors also make such materials desirable for use in Schottky diodes. Schottky diodes are desired for applications where energy losses while switching from forward bias to reverse bias and back can significantly impact the efficiency of a system and where high current conduction is desired under forward bias and little or no conduction is desired under reverse bias, such as when used as an output rectifier in a switching power supply. The Schottky diodes have lower turn-on voltages because of the lower barrier height of the rectifying metal-to-semiconductor junction and have faster switching speeds because they are primarily majority carrier devices. Nitride-based semiconductors are thus highly desirable as Schottky diodes because of their high electron mobility which reduces the device on-resistance when the Schottky diode is forward biased and because of their ability to withstand high breakdown fields when reverse biased. Additionally, gallium nitride and gallium nitride-based semiconductors have the further advantage that the barrier height at the metal-to-semiconductor junction, and thus the forward voltage drop, varies depending upon the type of metal used in the junction.

The lowered metal-to-semiconductor barrier height, however, can increase the reverse leakage current when the metal-to-semiconductor junction is reverse biased. Therefore, a lower doped semiconductor layer is desired for the metal-to-semiconductor junction. The lower doped layer, however, results in a higher on-resistance when the device is forward biased. It is thus further desirable to incorporate a more highly doped layer that serves as the major part of the conduction path and to minimize the thickness of the lower doped layer, thereby reducing the resistance when the device is forward biased. A tradeoff therefore exists when attempting to reduce the forward resistance of a device as well as reduce the reverse breakdown voltage. When the Schottky diode is optimized for higher reverse-bias breakdown voltages, such as by increasing the resistivity and thickness of the lower doped layer, the on-resistance increases. By contrast, when the device is optimized for low on-resistance, such as by providing a more highly doped and thicker low resistance layer, the breakdown voltage decreases.

To optimize the Schottky diode for both high reverse-bias breakdown voltage as well as for low forward bias on-resistance, a thin, very low doped layer is desired to serve as the metal-to-semiconductor contact. Such low doping levels, however, are very difficult to attain in a repeatable manner that is uniform across the layer.

It is therefore desirable to provide a Schottky diode that has a very low doped layer that can be formed repeatably with uniform doping.

SUMMARY OF THE INVENTION

The present invention provides a Schottky diode with a lower doped top layer that is formed using modulation doping.

According to an aspect of the invention, a semiconductor layer structure is formed. A modulation doped layer is formed atop at least a portion of another layer by forming at least one sub-layer of doped nitride semiconductor and at least one sub-layer of undoped nitride semiconductor atop the at least portion of the another layer whereby the modulation doped layer has a doping concentration of at most $2E16$ $cm^{-3}$.

According to another aspect of the invention, a semiconductor layer structure includes a modulation doped layer of nitride semiconductor disposed atop another layer. The modulation doped layer includes at least one sub-layer of doped nitride semiconductor and at least one sub-layer of undoped nitride semiconductor disposed atop the at least portion of the another layer whereby the modulation doped layer has a doping concentration of at most $2E16$ $cm^{-3}$.

In accordance with these aspects of the invention, alternating sub-layers of doped nitride semiconductor and undoped nitride semiconductor may be formed atop the at least portion of the another layer. Dopants from the doped sub-layer may be diffused into the undoped sub-layer to form the modulation doped layer, which has a doping concentration that is substantially uniform. The doped sub-layer and the undoped sub-layer may be formed by reactive sputtering, metal organic chemical vapor deposition (MOCVD), molecular beam epitaxy (MBE) or atomic layer epitaxy.

The modulation doped layer may include a gallium nitride-based semiconductor, which may include GaN, and may be n-type. The modulation doped layer may have a doping concentration of at least $4E15$ $cm^{-3}$. The modulation doped layer may have a thickness of at least 0.2 μm and/or at most 10 μm. The doped sub-layer of the modulation doped layer may have a thickness of at least 0.0005 μm and/or at most 0.1 μm. The undoped sub-layer of the modulation doped layer may have a thickness of at least 0.005 μm and/or at most 0.1 μm.

A Schottky junction may be formed having a layer structure according to these aspects of the invention and having a first metal contact layer formed atop the doped layer. The first metal contact layer may include platinum (Pt), palladium (Pd), or nickel (Ni).

A Schottky diode may be formed having the above Schottky junction and having an ohmic contact formed on at least a part of the another layer.

According to a further aspect of the invention, a Schottky diode is formed. A modulation doped layer is formed atop at least a portion of another layer by forming at least one sub-layer of doped nitride semiconductor and at least one sub-layer of undoped nitride semiconductor atop the at least portion of the another layer. A metallic contact layer is formed atop at least a part of the modulation doped layer such that a Schottky contact is formed therewith. At least one further metal contact layer is formed on at least a part of the another layer such that an ohmic contact is formed. A ratio of an on-resistance of the Schottky diode to a breakdown voltage of the Schottky diode is at most $2\times10^{-5}$ $\Omega\cdot cm^2/V$.

A Schottky diode is in accordance with a still further aspect of the invention. A modulation doped layer is disposed atop at least a portion of another layer and includes at least one sub-layer of doped nitride semiconductor and at least one sub-layer of undoped nitride semiconductor. A metallic contact layer is disposed atop at least a part of the modulation doped layer such that a Schottky contact is formed therewith. At least one further metal contact layer is disposed on at least a part of the another layer such that an ohmic contact is formed. A ratio of an on-resistance of the Schottky diode to a breakdown voltage of the Schottky diode is at most $2\times10^{-5}$ $\Omega\cdot cm^2/V$.

In accordance with these aspects of the invention, alternating sub-layers of doped nitride semiconductor and undoped nitride semiconductor may be formed atop the at least portion of the another layer. The doped sub-layer and the undoped sub-layer may be formed by reactive sputtering, metal organic chemical vapor deposition (MOCVD), molecular beam epitaxy (MBE) or atomic layer epitaxy.

The modulation doped layer may include a gallium nitride-based semiconductor, which may include GaN, and may be n-type. The modulation doped layer may have a thickness of at least 0.2 μm and/or at most 10 μm. The doped sub-layer of the modulation doped layer may have a thickness of at least 0.005 μm and/or at most 0.1 μm. The undoped sub-layer of the modulation doped layer may have a thickness of at least 0.005 μm and/or at most 0.1 μm.

The another layer may be another doped layer of nitride semiconductor that is formed atop a substrate before forming the doped layer, the doped layer and the another doped layer may be of the same conductivity type, and the another doped layer may be more highly doped than the doped layer. The another doped layer may be formed by either reactive sputtering, metal organic chemical vapor deposition (MOCVD), molecular beam epitaxy (MBE) or atomic layer epitaxy. The another doped layer may include a gallium nitride-based semiconductor, which may include GaN, and may be n-type. The another doped layer may have a doping concentration of at least $4E18$ $cm^{-3}$.

The substrate may be sapphire, silicon carbide, doped silicon or undoped silicon.

The Schottky metal contact layer may include platinum (Pt), palladium (Pd), or nickel (Ni). The ohmic metal contact layer may be aluminum/titanium/platinum/gold (Al/Ti/Pt/Au) or titanium/aluminum/platinum/gold (Ti/Al/Pt/Au).

According to an additional aspect of the invention, a Schottky diode is formed. A lower layer of n-type doped nitride semiconductor is formed atop a substrate. An upper layer is formed of alternating sub-layers of n-type doped nitride semiconductor and undoped nitride semiconductor atop at least a portion of the lower layer of nitride semiconductor. The sub-layers may be formed by reactive sputtering, metal organic chemical vapor deposition (MOCVD), molecular beam epitaxy (MBE) or atomic layer epitaxy to form an upper layer of nitride semiconductor. The lower layer of nitride semiconductor is more highly doped than the upper layer of nitride semiconductor. A first metal contact layer is formed atop the upper layer of nitride semiconductors such that a Schottky contact is formed. A second metal contact layer is formed atop the lower layer of nitride semiconductor such that an ohmic contact is formed. A ratio of an on-resistance of the Schottky diode to a breakdown voltage of the Schottky diode is at most $2\times10^{-5}$ $\Omega\cdot cm^2/V$.

A Schottky diode is in accordance with yet an additional aspect of the invention. A lower layer of n-type doped nitride semiconductor is disposed atop a substrate. An upper layer of nitride semiconductor is disposed atop at least a portion of said the layer of nitride semiconductor upper layer and includes alternating sub-layers of n-type doped nitride semiconductor and undoped nitride semiconductor. The lower layer of nitride semiconductor is more highly doped than the upper layer of nitride semiconductor. A first metal contact layer is disposed atop the upper layer of nitride semiconductors such that a Schottky contact is formed. A second metal contact layer is disposed atop the lower layer of nitride semiconductor such that an ohmic contact is formed. A ratio of an on-resistance of the Schottky diode to a breakdown voltage of the Schottky diode is at most $2\times10^{-5}$ $\Omega\cdot cm^2/V$.

In accordance with these aspects of the invention, one or both of the upper layer of nitride semiconductor and the lower layer of nitride semiconductor includes a gallium nitride-based semiconductor, which may include GaN.

The foregoing aspects, features and advantages of the present invention will be further appreciated when considered with reference to the following description of the preferred embodiments and accompanying drawings.

DETAILED DESCRIPTION

As used in the present disclosure, the term "III-V semiconductor" refers to a compound semiconductor material according to the stoichiometric formula $Al_a In_b Ga_c N_d As_e P_f$ where (a+b+c) is about 1 and (d+e+f) is also about 1. The term "nitride semiconductor" or "nitride-based semiconductor" refers to a III-V semiconductor in which d is 0.5 or more, most typically about 0.8 or more. Preferably, the semiconductor materials are pure nitride semiconductors, i.e., nitride semiconductors in which d is about 1.0. The term "gallium nitride based semiconductor" as used herein refers to a nitride semiconductor including gallium, and most preferably including gallium as the principal metal present, i.e., having $c \geq 0.5$ and most preferably $\geq 0.8$. The semiconductors may have p-type or n-type conductivity, which may be imparted by conventional dopants and may also result from the inherent conductivity type of the particular semiconductor material. For example, gallium nitride-based semiconductors having defects typically are inherently n-type even when undoped. Conventional electron donor dopants such as Si, Ge, S, and O, can be used to impart n-type conductivity to nitride semiconductors, whereas p-type nitride semiconductors may include conventional electron acceptor dopants such as Mg and Zn.

Figure 1:
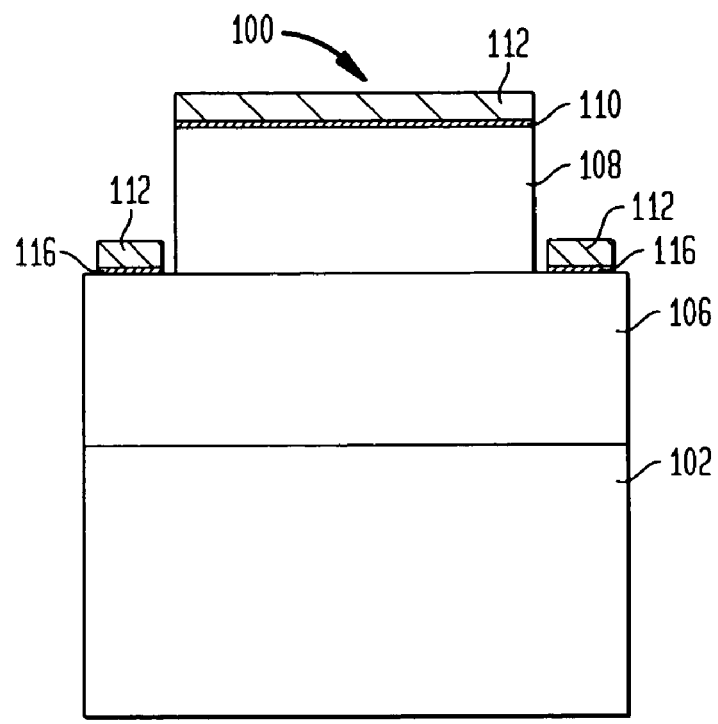
FIG. 1 is a fragmentary, cross-sectional view on an enlarged scale of a semiconductor structure according to an embodiment of the invention.

FIG. 1 illustrates a cross-sectional view of a nitride-based Schottky diode formed in accordance with the invention. The Schottky diode 100 includes a substrate 102 upon which further layers are grown. Ideally, the substrate should have a lattice spacing, namely the spacing between adjacent atoms in its crystal lattice, that is equal to that of the gallium nitride or other nitride-based semiconductors that are to be grown atop the substrate to reduce the number of defects, such as dislocations in the crystal lattice, that are formed in the nitride-based semiconductor. Additionally, it is also highly desirable for the substrate to have a thermal expansion coefficient at least equal that of the nitride-based semiconductor so that when the substrate and nitride-based semiconductor are cooled after the growth of the nitride-based semiconductor layer, the substrate will contract more than the semiconductor layer, thereby compressing the semiconductor layer and avoiding the formation of cracks in the layer.

The substrate 102 may be an insulating or non-conducting substrate, such as a crystalline sapphire wafer, a silicon carbide wafer or an undoped silicon wafer, that is used to form a laterally conducting device. Alternatively, the substrate 102 may be a doped silicon wafer that is used to form a vertically conducting device, such as is described in U.S. Provisional Application No. 60/430,837, filed Dec. 4, 2002, and U.S. patent application Ser. No. 10/721,488, filed Nov. 25, 2003, the disclosures of which are incorporated herein by reference.

To compensate for the lattice mismatch and the thermal expansion coefficient mismatch between the nitride-based semiconductor layer and the substrates, a buffer layer (not shown) may be provided atop the substrate 102. The buffer layer may be comprised of one or more layers of nitride-based materials to provide a transition between the lattice structure of the substrate and the lattice structure of the gallium nitride or other nitride-based semiconductor layer.

A highly doped nitride-based semiconductor layer 106, such as gallium nitride or a gallium nitride-based semiconductor, is then formed atop the buffer layer or, when the buffer layer is not present, directly atop the substrate 102. The highly doped layer 106 is typically formed using an epitaxial growth process. A reactive sputtering process may be used where the metallic constituents of the semiconductor, such as gallium, aluminum and/or indium, are dislodged from a metallic target disposed in close proximity to the substrate while both the target and the substrate are in a gaseous atmosphere that includes nitrogen and one or more dopants. Alternatively, metal organic chemical vapor deposition (MOCVD) is employed wherein the substrate is exposed to an atmosphere containing organic compounds of the metals as well as to a reactive nitrogen-containing gas, such as ammonia, and dopant-containing gas while the substrate is maintained at an elevated temperature, typically around 700-1100° C. The gaseous compounds decompose and form a doped metal nitride semiconductor in the form of a film of crystalline material on the surface of the substrate 102. The substrate and the grown film are then cooled. As a further alternative, other epitaxial growth methods, such as molecular beam epitaxy (MBE) or atomic layer epitaxy may be used. The resulting highly doped layer 106 is preferably n-type and has a doping concentration of at least 4E18 cm$^{-3}$.

A lower doped nitride-based semiconductor layer 108, such as gallium nitride or a gallium nitride-based semiconductor, is formed atop at least atop part of the highly doped layer 106 by modulation doping. Typically, the lower doped layer 108 is formed atop the entire surface of the higher doped layer 106, the lower doped layer is then patterned, and portions of the lower doped layer are etched away to expose regions of the higher doped layer 106. Such patterning and etching steps may be carried out in a known manner.

A Schottky metal layer 110 is formed atop the lower doped layer 108 in a known manner and forms the metal-to-semiconductor junction with the lower doped layer, known as a Schottky junction. The Schottky metal layer is typically comprised of a platinum (Pt) layer, a palladium (Pd) layer, or a nickel (Ni) layer, though other high work function materials may be used to obtain the desired barrier height.

A further metal layer 116 is disposed atop the highly doped layer 106 and forms an ohmic contact with the highly doped layer. The ohmic metal layer is typically a stack of one or more metals, such as an aluminum/titanium/platinum/gold (Al/Ti/Pt/Au) stack or a titanium/aluminum/platinum/gold (Ti/Al/Pt/Au) stack, though other metals or combinations of metals may be used. Examples of an Al/Ti/Pt/Au ohmic contact stack and its formation are described in U.S. Pat. No. 6,653,215, which is titled "Contact To n-GaN With Au Termination" and issued on Nov. 25, 2003, the disclosure of which is incorporated herein by reference.

A thicker bond pad metal layer 112 is formed atop the Schottky metal layer 110 and the ohmic metal layer 116. The bond pad metal layer is typically a thick layer of aluminum (Al) or gold (Au). A passivation layer (not shown) comprised of an insulator may be formed at least between the ohmic metal and Schottky metal layers.

The Schottky metal layer 110, the ohmic metal layer 106 and the bond pad metal layers 112 may be formed using methods known in the art.

The Schottky diode structure shown in FIG. 1 results in a device that uses lateral conduction in the gallium nitride-based layers to carry the forward current. The forward current travels vertically from the Schottky metal layer 110 across the Schottky barrier through the relatively thin lower doped layer 108 and then along the horizontal dimension of the highly doped layer 106 to the ohmic metal layer 116.

Figure 2:
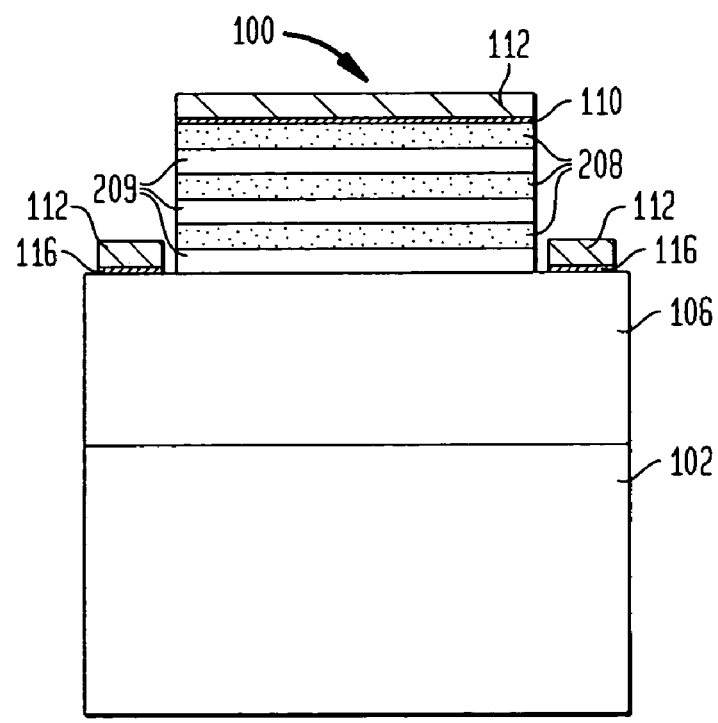
FIG. 2 is a fragmentary, cross-sectional view on an enlarged scale of the semiconductor structure shown in FIG. 1 showing the modulation doping of the top layer.

FIG. 2 illustrates, in greater detail, the nitride-based Schottky diode 100 shown in FIG. 1 to show the modulation doping used to form the lower doped layer. Like reference numerals shown in FIG. 2 represent structures corresponding to those shown in FIG. 1.

The modulation doping is attained by alternatively depositing sub-layers of doped nitride-based materials 208 and sub-layers of undoped nitride-based materials 209, such as sub-layers of doped and undoped gallium nitride or gallium nitride-based materials. The alternating doped and undoped sub-layers are grown epitaxially atop the highly doped layer 106 preferably using such methods as reactive sputtering, MOCVD, MBE or atomic layer epitaxy.

Optionally, the alternating doped and undoped sub-layers are sufficiently thin such that heating the substrate during epitaxial growth causes the dopants in the doped layers to diffuse into the undoped layers resulting in a substantially uniform doping concentration across the entire lower doped layer that is lower than the initial doping concentrations in the doped sub-layers 208. However, the invention is equally applicable in the absence of such diffusion.

The resulting lower doped layer is preferably n-type and preferably has a doping concentration across the lower doped layer of between 7.5E18 to 1.4E16 cm$^{-3}$ when measured after formation of the lower doped layer and has a doping concentration of between 4E15 to 2E16 after completion of device processing. The lower doped layer preferably has a thickness of 0.2 μm to 10 μm with the doped layers each having a preferred thickness of 0.005 μm to 0.1 μm and the undoped layers each having a preferred thickness of 0.005 μm to 0.1 μm. The thickness and doping concentration of the lower doped layer are determined by the desired breakdown voltage of the device, with increased thicknesses and/or lower doping concentrations providing higher breakdown voltages. As an example, for a desired breakdown voltage of 200V, the lower doped layer may have a thickness of between 1 to 4 µm with corresponding doping concentrations of between 1E15 to 5E16 cm$^{-3}$.

Advantageously, the modulation doping process of the invention permits the use of a lower doped layer that is attainable in a repeatable and uniform manner. The alternating doped sub-layers each have a sufficiently high doping concentration to be formed in a repeatable manner. The resulting combination of doped sub-layers and undoped sub-layers therefore results in a repeatable and uniform dopant concentration across the entire low doped layer.

The resulting structure has the further advantage that the on-resistance of the device when under forward bias is low while the breakdown voltage is high under reverse bias. Typically, the ratio of the on-resistance of the device to the reverse breakdown voltage of the device is at most $2\times10^{-5}$ $\Omega\cdot cm^2/V$. As an example, for a Schottky diode that has a breakdown voltage of 200 V, an on-resistance of 0.0035 $\Omega\cdot cm^2$, results in a ratio of $1.75\times10^{-5}$ $\Omega\cdot cm^2/V$. As a further example, for a device having a breakdown voltage of 600 V, an on-resistance of 0.009 $\Omega\cdot cm^2$ results in a ratio of $1.5\times10^{-2}$ $\Omega\cdot cm^2/V$.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of forming a semiconductor layer structure, said method comprising:
forming a doped nitride semiconductor layer by alternately growing doped nitride semiconductor material and initially undoped nitride semiconductor material repeatedly atop at least a portion of another layer in a manner that causes part of the dopants in the doped nitride semiconductor material to diffuse into the initially undoped nitride semiconductor material and results in the doped nitride semiconductor layer having a doping concentration that is substantially uniform along its depth and at most 2E16 cm$^{-3}$.

2. A method as claimed in claim 1 wherein said forming step is carried out by a process selected from the group consisting of reactive sputtering, metal organic chemical vapor deposition (MOCVD), molecular beam epitaxy (MBE) and atomic layer epitaxy.

3. A method as claimed in claim 1 wherein said doped nitride semiconductor layer includes a gallium nitride-based semiconductor.

4. A method as claimed in claim 1 wherein said doped nitride semiconductor layer includes GaN.

5. A method as claimed in claim 1 wherein said doped nitride semiconductor layer is n-type.

6. A method as claimed in claim 1 wherein said doped nitride semiconductor layer has a doping concentration of at least 4E15 cm$^{-3}$.

7. A method as claimed in claim 1 wherein said doped nitride semiconductor layer has a thickness of at least 0.2 µm.

8. A method as claimed in claim 1 wherein said doped nitride semiconductor layer has a thickness of at most 10 µm.

9. A method as claimed in claim 1 wherein said doped nitride semiconductor material is grown to a thickness of at least 0.005 µm.

10. A method as claimed in claim 1 wherein said doped nitride semiconductor material is grown to a thickness of at most 0.1 µm.

11. A method as claimed in claim 1 wherein said initially undoped nitride semiconductor material is grown to a thickness of at least 0.005 µm.

12. A method as claimed in claim 1 wherein said initially undoped nitride semiconductor material is grown to a thickness of at most 0.1 µm.

13. A method of forming a Schottky junction including forming a doped nitride semiconductor layer as claimed in claim 1 and forming a metal contact layer atop said modulation doped layer.

14. A method of forming a Schottky diode including forming a Schottky junction as claimed in claim 13 and forming an ohmic contact on another portion of said another layer.

15. A method of forming a Schottky diode, said method comprising:
forming a doped nitride semiconductor layer by alternately growing doped nitride semiconductor material and initially undoped nitride semiconductor material repeatedly atop at least a portion of another layer in a manner that causes part of the dopants in the doped nitride semiconductor material to diffuse into the initially undoped nitride semiconductor material and results in the doped nitride semiconductor layer having a doping concentration that is substantially uniform along its depth and at most 2E16 cm$^{-3}$;
forming a metallic contact layer atop at least part of said doped nitride semiconductor layer to form a Schottky junction therewith; and
forming at least one further metallic contact layer on at least part of said another layer in substantially ohmic contact therewith;
whereby a ratio of an on-resistance of said Schottky diode to a breakdown voltage of said Schottky diode is at most $2\times10^{-5}$ $\Omega\;cm^2/V$.

16. A method as claimed in claim 15 wherein said step of forming a doped nitride semiconductor layer is carried out by a process selected from the group consisting of reactive sputtering, metal organic chemical vapor deposition (MOCVD), molecular beam epitaxy (MBE) and atomic layer epitaxy.

17. A method as claimed in claim 15 wherein said doped nitride semiconductor layer includes a gallium nitride-based semiconductor.

18. A method as claimed in claim 15 wherein said doped nitride semiconductor layer includes GaN.

19. A method as claimed in claim 15 wherein said doped nitride semiconductor layer is n-type.

20. A method as claimed in claim 15 wherein said doped nitride semiconductor layer has a thickness of at least 0.2 µm.

21. A method as claimed in claim 15 wherein said doped nitride semiconductor layer has a thickness of at most 10 µm.

22. A method as claimed in claim 15 wherein said doped nitride semiconductor material is grown to a thickness of at least 0.005 µm.

23. A method as claimed in claim 15 wherein said doped nitride semiconductor material is grown to a thickness of at most 0.1 µm.

24. A method as claimed in claim 15 wherein said initially undoped nitride semiconductor material is grown to a thickness of at least 0.005 µm.

25. A method as claimed in claim 15 wherein said initially undoped nitride semiconductor material is grown to a thickness of at most 0.1 μm.

26. A method as claimed in claim 15 wherein said metallic contact layer is selected from the group consisting of platinum (Pt), palladium (Pd), and nickel (Ni).

27. A method as claimed in claim 15 wherein said another layer comprises another doped layer of nitride semiconductor, and said method further comprises forming said another layer atop a substrate prior to said step of forming said doped nitride semiconductor layer atop said at least portion of said another layer, said doped nitride semiconductor layer and said another layer being of the same conductivity type, said another layer being more highly doped than said doped nitride semiconductor layer.

28. A method as claimed in claim 27 wherein said another doped layer includes a gallium nitride-based semiconductor.

29. A method as claimed in claim 27 wherein said another doped layer includes GaN.

30. A method as claimed in claim 27 wherein said another doped layer is n-type.

31. A method as claimed in claim 27 wherein said another doped layer has a doping concentration of at least $4E18$ $cm^{-3}$.

32. A method as claimed in claim 27 wherein said substrate is selected from the group consisting of sapphire, silicon carbide, doped silicon and undoped silicon.

33. A method as claimed in claim 15 wherein said ohmic metal contact layer is selected from the group consisting of aluminum/titanium/platinum/gold (Al/Ti/Pt/Au) and titanium/aluminum/platinum/gold (Ti/Al/Pt/Au).

34. A method of forming a Schottky diode, said method comprising:

forming a lower layer of n-type doped nitride semiconductor atop a substrate;

forming an upper layer of n-type doped nitride semiconductor by alternately growing n-type doped nitride semiconductor material and initially undoped nitride semiconductor material repeatedly atop at least a portion of said lower layer of nitride semiconductor in a manner that causes part of the dopants in the doped nitride semiconductor material to diffuse into the initially undoped nitride semiconductor material and results in the upper layer of n-type doped nitride semiconductor having a doping concentration that is substantially uniform along its depth and at most $2E16$ $cm^{-3}$, said forming of said upper layer of n-type doped nitride semiconductor being carried out by a process selected from the group consisting of reactive sputtering, metal organic chemical vapor deposition (MOCVD), molecular beam epitaxy (MBE) and atomic layer epitaxy, said lower layer of nitride semiconductor being more highly doped than said upper layer of nitride semiconductor;

forming a first metal contact layer atop said upper layer of n-type doped nitride semiconductor such that a Schottky contact is formed; and forming a second metal contact layer atop said lower layer of n-type doped nitride semiconductor such that an ohmic contact is formed;

whereby a ratio of an on-resistance of said Schottky diode to a breakdown voltage of said Schottky diode is at most $2 \times 10^{-5}$ $\Omega$ $cm^2/V$.

35. A method as claimed in claim 34 wherein at least one of said upper layer of ntype doped nitride semiconductor and said lower layer of n-type doped nitride semiconductor includes a gallium nitride-based semiconductor.

36. A method as claimed in claim 34 wherein at least one of said upper layer of n-type doped nitride semiconductor and said lower layer of n-type doped nitride semiconductor includes GaN.

* * * * *